US012765108B2

(12) United States Patent
Huang et al.

(10) Patent No.: US 12,765,108 B2
(45) Date of Patent: Oct. 13, 2026

(54) PHOTODIODE STRUCTURE, PREPARATION METHOD AND CIRCUIT STRUCTURE

(71) Applicant: SHANGHAI ADVANCED RESEARCH INSTITUTE, CHINESE ACADEMY OF SCIENCES, Shanghai (CN)

(72) Inventors: Zunkai Huang, Shanghai (CN); Quanze Li, Shanghai (CN); Hui Wang, Shanghai (CN); Yongxin Zhu, Shanghai (CN); Ning Wang, Shanghai (CN); Li Tian, Shanghai (CN)

(73) Assignee: SHANGHAI ADVANCED RESEARCH INSTITUTE, CHINESE ACADEMY OF SCIENCES, Shanghai (CN)

( * ) Notice: Subject to any disclaimer, the term of this patent is extended or adjusted under 35 U.S.C. 154(b) by 245 days.

(21) Appl. No.: 18/011,515

(22) PCT Filed: Jul. 2, 2021

(86) PCT No.: PCT/CN2021/104240
§ 371 (c)(1),
(2) Date: Mar. 14, 2023

(87) PCT Pub. No.: WO2022/217760
PCT Pub. Date: Oct. 20, 2022

(65) Prior Publication Data

US 2024/0030368 A1 Jan. 25, 2024

(30) Foreign Application Priority Data

Apr. 13, 2021 (CN) ......................... 202110394839.8

(51) Int. Cl.
*H10F 77/14* (2025.01)
*H10F 71/00* (2025.01)
*H10F 77/00* (2025.01)

(52) U.S. Cl.
CPC ........... *H10F 77/148* (2025.01); *H10F 71/00* (2025.01); *H10F 77/953* (2025.01)

(58) Field of Classification Search
CPC ...... H10F 77/148; H10F 77/953; H10F 77/95; H10F 71/00; H10F 30/221; H10F 39/103
See application file for complete search history.

(56) References Cited

U.S. PATENT DOCUMENTS

| | | | | |
|---|---|---|---|---|
| 4,463,368 A * | 7/1984 | Mcintyre | H10F 30/225 257/652 |
| 2004/0110336 A1* | 6/2004 | King | H10P 30/20 257/E21.639 |

(Continued)

FOREIGN PATENT DOCUMENTS

| | | |
|---|---|---|
| CN | 101043043 Y | 9/2007 |
| CN | 103311260 A | 9/2013 |

(Continued)

*Primary Examiner* — Sitaramarao S Yechuri
(74) *Attorney, Agent, or Firm* — IPRTOP LLC

(57) ABSTRACT

A novel photodiode structure, a preparation method and a circuit structure are provided. The novel photodiode structure includes a substrate having a first doping type, a functional doping area having a second doping type, a surface doping area having the first doping type, and an auxiliary doping area having the second doping type. By forming a non-uniformly doped functional doping area, the present disclosure forms a self-built potential difference in the functional doping area and drives the moving direction of the photogenerated carriers. The photogenerated carriers may be accelerated by the potential difference, so that the collected carriers will directly enter the subsequent circuit through the transport gate. In addition, the loop shape of the (Continued)

auxiliary doping area can increase the area of receiving charges, in a result, the auxiliary doping area can receive the transported carriers faster, thereby further enhancing the transport efficiency of the photogenerated carriers.

18 Claims, 5 Drawing Sheets

(56) References Cited

U.S. PATENT DOCUMENTS

| | | | | |
|---|---|---|---|---|
| 2010/0237390 | A1* | 9/2010 | Kenichi | H10F 39/803<br>257/E31.073 |
| 2011/0221045 | A1* | 9/2011 | Morimoto | H10F 39/014<br>257/657 |
| 2017/0133419 | A1* | 5/2017 | Watanabe | H10F 39/807 |

FOREIGN PATENT DOCUMENTS

| | | | | | |
|---|---|---|---|---|---|
| CN | 103413816 | Y | | 11/2013 | |
| CN | 110277416 | A | | 9/2019 | |
| JP | 2009506543 | A | * | 2/2009 | H10F 77/148 |
| KR | 20020096336 | A | * | 12/2002 | H10F 39/807 |
| WO | WO-2008108884 | A1 | * | 9/2008 | H04N 25/65 |

* cited by examiner

PHOTODIODE STRUCTURE, PREPARATION METHOD AND CIRCUIT STRUCTURE

TECHNICAL FIELD

The present disclosure relates to the field of photoelectric conversion devices, in particular, to a novel photodiode structure, a preparation method and a circuit structure.

BACKGROUND

Photodiodes are semiconductor devices that respond to high-energy particles and photons by absorbing the photons or high-energy particles and outputting a current proportional to the incident power to an external circuit. Photodiodes are used in a wide range of applications and research areas, including spectroscopy, photography, analytical instruments, optical position sensors, beam alignment, surface characterization, laser range finders, optical communications and medical imaging instruments.

Currently, the general research trend in photodiodes is to design small-scale devices, with less research on performance enhancement of large-scale devices. However, in applications such as scientific and medical imaging, where small-scale diodes are no longer advantageous due to signal strength limitations, large-scale photodiodes are often needed to improve signal-to-noise performance. A central design challenge in the field of large-scale photodiode device research is to achieve fast and complete charge transfer, which is critical in high-speed, low-noise imaging applications. Typically, the operating efficiency of pixels is determined by the readout speed of electronic devices and the transfer speed of internal charges of the electronic devices. However, as the photodiode dimension increases and the charge transport distance increases, the charge transfer time and efficiency will be affected and need to be optimized.

Charge transfer is based on a complex process driven by various coupling processes, including drift, diffusion, and self-induced drift. In the absence of an electric field, diffusion will be the main factor, and the charge transfer time will be proportional to the square of the distance. In the presence of an electric field, the charge transfer time will be proportional to the distance. Currently, various methods have been proposed to improve the charge transfer rate in large-scale photodiodes, including diode shaping technique, multiple doping technique, external biasing technique, PIN-PD, etc. The diode shaping technique has the disadvantage of being complex to implement and may reduce the fill factor. Using the multiple doping technique may enable an increase in charge transfer speed, but it is usually implemented using several additional masks, and each mask corresponds to one doping level, which significantly increases the manufacturing cost. In general, there is a great demand and requirement for large-scale photodiodes in the fields of science and medical imaging, especially in terms of charge transfer efficiency, and the current mainstream methods need to be further optimized in terms of process complexity, actual manufacturing cost, and universality.

The traditional technology has problems such as long internal charge transfer time, low efficiency, and difficulty in collecting photogenerated charges.

SUMMARY

The present disclosure provides a novel photodiode structure, a preparation method and a circuit structure.

The photodiode structure includes a substrate having a first doping type, a functional doping area having a second doping type and formed in the substrate, a surface doping area having the first doping type and formed in the functional doping area from a top surface of the functional doping area, a gate structure disposed on the substrate, and an auxiliary doping area having the second doping type and formed in the functional doping area.

The substrate has a first doping concentration. The functional doping area has a non-uniform doping concentration distribution to form a potential gradient in the functional doping area. The surface doping area has a second doping concentration. The auxiliary doping area connects the gate structure to the functional doping area and is spaced by an interval from the surface doping area, and the auxiliary doping area has a doping concentration greater than a doping concentration of the functional doping area.

Optionally, the surface doping area and the auxiliary doping area both have a loop shape, the gate structure is located within the auxiliary doping area having the loop shape, and the gate structure has a loop shape, an internal doping area is formed in the functional doping area and is located within an area surrounded by an inner edge of the loop shape formed by the gate structure, the internal doping area and the auxiliary doping area have the same doping type and doping concentration.

Optionally, the first doping type is p-type, and the second doping type is n-type, the surface doping area, the functional doping area and the substrate form a PNP-type structure.

Optionally, the doping concentration distribution of the functional doping area includes any one of linear distribution, square root distribution.

The present disclosure further provides a method for preparing a novel photodiode structure. The method includes: providing a substrate having a first doping type, the substrate comprises a first surface and a second surface opposite to the first surface, and the substrate has a first doping concentration; forming a functional doping area having a second doping type in the substrate from the first surface, the functional doping area has a non-uniform doping concentration distribution to form a potential gradient in the functional doping area; forming a surface doping area having the first doping type and formed in the functional doping area from the top surface, the surface doping area has a second doping concentration; forming a gate structure on the first surface of the substrate; and forming an auxiliary doping area having the second doping type in the functional doping area from the first surface, the auxiliary doping area connects the gate structure to the functional doping area and is spaced by an interval from the surface doping area, the auxiliary doping area has a doping concentration greater than a doping concentration of the functional doping area.

Optionally, the functional doping area has a predetermined concentration distribution and is formed by ion implantation and diffusion of implanted ions.

Optionally, a concentration distribution function of the functional doping area after ion implantation is:

$$C_y = C_0 \exp\left[-\frac{1}{2}\left(\frac{y - R_A}{\Delta R_A}\right)^2\right],$$

where $R_A$ represents an average range of an impurity in the substrate and corresponds to implantation energy, and has a peak doping concentration in an implantation direction, $\Delta R_A$ represents a depth change when the peak doping concentration drops by half, $C_y$ represents a concentration in the implantation direction; y represents a position in the implantation direction, and $C_0$ represents a concentration of the implanted ions.

Optionally, a concentration distribution function of the functional doping area during diffusion of the implanted ions is:

$$C(x,t)=\frac{1}{L\sqrt{\pi}}\int_{x-w}^{x+w}e^{-\left(\frac{x-x_0}{L}\right)^2}C_0dx,$$

where $x_0$ represents a coordinate value of an ion implantation point, x represents a distance from the ion implantation point, $L=2\sqrt{Dt}$ represents a characteristic length of a diffusion process, D represents a diffusion coefficient, w represents a distance by which the ion implantation point is widen towards each of two opposite sides of the ion implantation point, and C(x,t) represents a concentration at a position having a distance x from the ion implantation point at a diffusion time t.

Optionally, the method for preparing the novel photodiode structure further includes: preparing a mask plate on the substrate, and performing ion implantation based on the mask plate to form the functional doping area, a plurality of nested openings each with a loop shape is formed in the mask plate, a dimension of each of the plurality of nested openings is set according to a concentration at a corresponding position of the each of the plurality of nested openings, a concentration distribution function of a position x of the plurality of nested openings is:

$$C(x)=\int\frac{1}{l\sqrt{\pi}}\int_{x-w_i}^{x+w_i}e^{-\left(\frac{x-x_i}{L}\right)^2}C_0dx\approx\sum_{i=1}^{n}C_0\frac{1}{l\sqrt{\pi}}\int_{x-w_i}^{x+w_i}e^{-\left(\frac{x-x_i}{l}\right)^2}C_0dx,$$

where $C_0$ represents a concentration of implanted ions, $x_i$ represents a position of the center of the $i^{th}$ opening of the plurality of nested openings, l represents a characteristic length of a diffusion process of each of the plurality of nested openings, and $$l=\frac{x_n-x_1}{n-1},$$

$w_i$ represents a width of the $i^{th}$ opening of the plurality of nested openings, and $$w_i=\frac{l}{2}\frac{C(x_i)}{C_0}.$$

The present disclosure further provides a circuit structure including the above novel photodiode structure. The circuit structure includes: the above novel photodiode structure, a charge receiving module, and an amplifier module.

The surface doping area of the novel photodiode structure is grounded. The charge receiving module is electrically connected to a drain structure of the novel photodiode structure and receives charges stored in the novel photodiode structure during reset. The charge receiving module comprises an integrating capacitor and a control switch. Two input ends of the amplifier module are electrically connected to a comparison voltage and to the drain structure, respectively, and an output end of the amplifier module outputs the amplified signal. The amplifier module comprises a charge amplifier and a control switch.

Optionally, the output end of the amplifier module is connected to a column output of pixels, and a noise function at the column output of pixels is:

$$\text{Noise}(V)=\frac{\sqrt{KTC_{diode}(VREF)}}{C}.$$

In the equation, K represents the Boltzmann constant, T represents a temperature, and $C_{diode}$ (VREF) represents a capacitance of a voltage reference (VREF).

As mentioned above, in the novel photodiode structure, preparation method and circuit structure of the present disclosure, a non-uniformly doped functional doping area is formed, thus forming a self-built potential difference in the functional doping area and driving the moving direction of the photogenerated carriers. For example, the photogenerated carriers may be accelerated by the potential difference, so that the collected carriers will directly enter the subsequent circuit through the transport gate (TG). In addition, the loop shape of the auxiliary doping area can increase the area of receiving charges, in a result, the auxiliary doping area can receive the transported carriers faster, thereby further enhancing the transport efficiency of the photogenerated carriers.

REFERENCE NUMERALS

Figure 1:
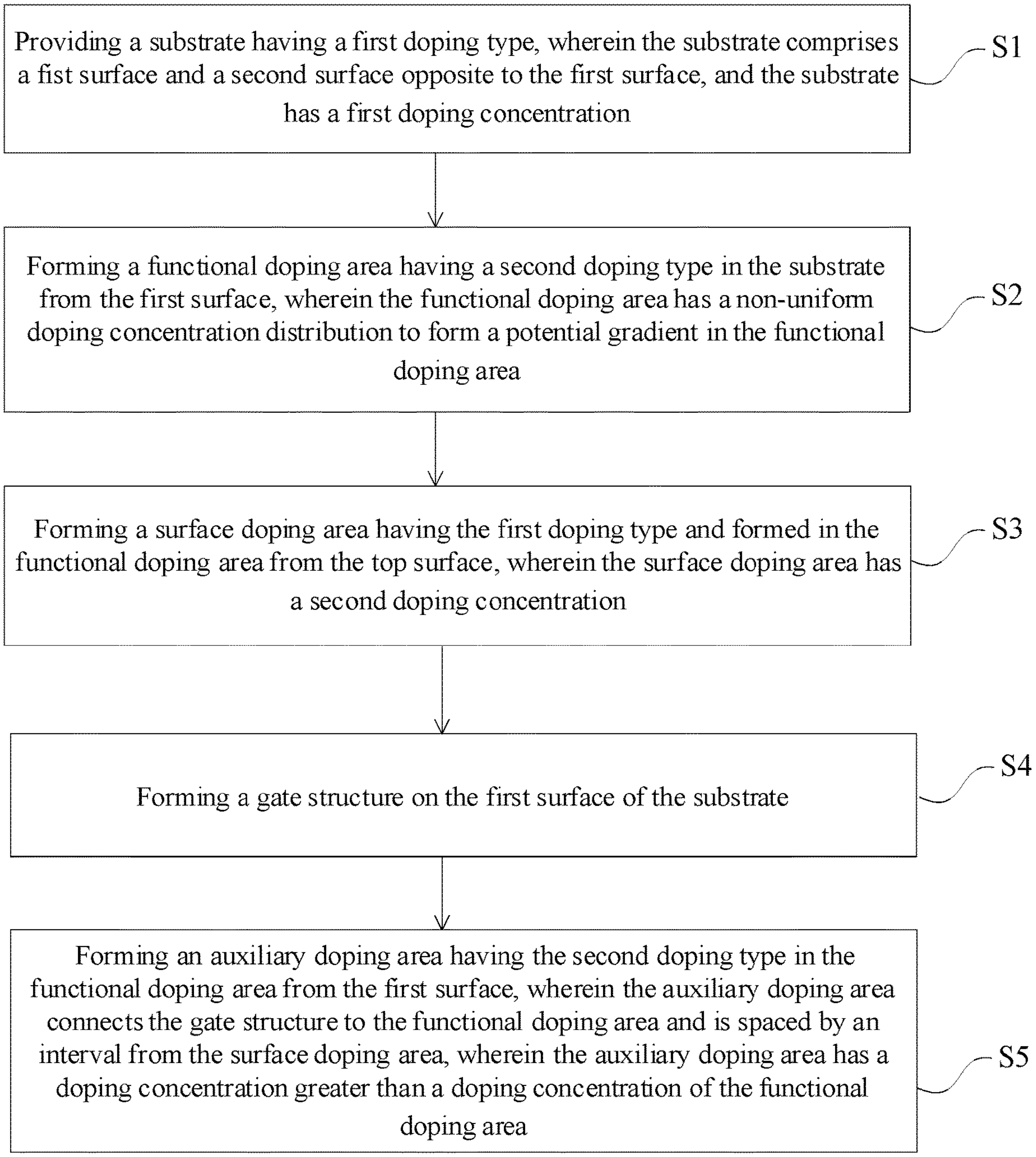
FIG. 1 shows a flow chart for preparing a novel photodiode structure according to an embodiment of the present disclosure.

101, 201 Substrate
102, 202 Functional doping area
103、203 Surface doping area

104, 204 Gate structure
105, 205 Auxiliary doping area
106, 206 Source structure
301 Mask plate
301*a* Opening
400 Charge receiving module
500 Amplifier module
S1 to S5 Steps

DETAILED DESCRIPTION

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

In the detailed description of examples of the disclosure, for the purpose of illustration, the cross-sectional view indicating the structure of the device will not be partially enlarged according to the general scale, and the schematic views are only examples, which do not intend to limit the protection scope the present disclosure. In addition, in the actual production, the three-dimensional space dimensions including the length, width and depth of the device should be included.

For the purpose of illustration, spatial relationship terms such as “below”, “under”, “lower”, “down”, “above”, “on”, etc. may be used to describe the relationship of an element or feature to other elements or features shown in the accompanying drawings. It will be understood that these spatial relationship terms are intended to encompass directions of the device in use or operation other than those depicted in the accompanying drawings. In addition, when a first layer is referred to as being “between” two second layers, the first layer may be only one layer between the two second layers, or there may be two or more layers between the two second layers. In addition, “between . . . ” as used in the present disclosure includes two endpoint values.

In the context of the present disclosure, the structure described with the first feature “on” the second feature may include embodiments where the first and second features are in direct contact, or it may include embodiments where additional features are formed between the first and second features such that the first and second features may not be in direct contact.

It needs to be stated that the drawings provided in the following embodiments are just used for schematically describing the basic concept of the present disclosure, thus illustrating components related to the present disclosure and are not drawn according to the numbers, shapes and sizes of components during actual implementation, the configuration, number and scale of each component during actual implementation thereof may be freely changed, and the component layout configuration thereof may be more complex.

Figure 4:
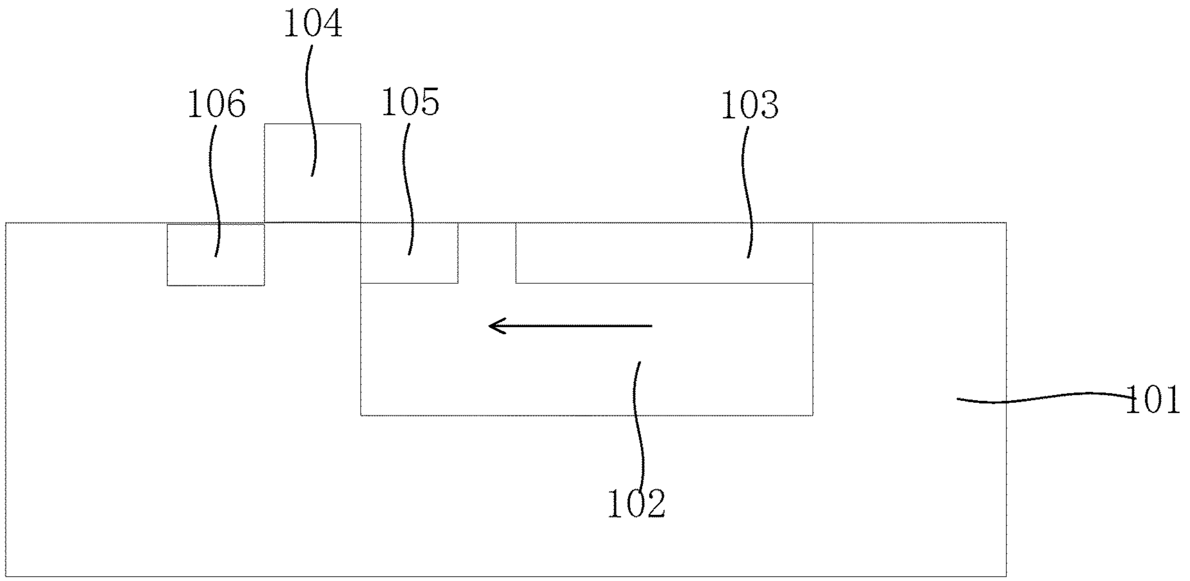
FIG. 4 shows a schematic diagram of a novel photodiode structure with a surface doping area, an auxiliary doping area, a gate structure and a source structure according to an embodiment of the present disclosure.

As shown in FIG. 4, the present disclosure provides a novel photodiode structure. The photodiode structure includes a substrate 101, a functional doping area 102, a surface doping area 103, an auxiliary doping area 105 and a gate structure 104. In addition, the photodiode may further include a source structure 106 to form a connection to pixels, which may be designed according to actual needs.

The structure of the present disclosure will be described in detail below in conjunction with the accompanying drawings.

As shown in FIG. 4, the novel photodiode structure of the present disclosure includes the substrate 101, and relates to optimization of photoelectric conversion and carrier transport performance. For large-scale photodiodes, as the dimension of the device increases, the charge transport distance increases, and the charge transfer time increases accordingly, while the internal charge transfer speed directly affects the efficiency of pixels as well as higher-level circuits. Improving the internal charge transfer speed of large-scale photodiodes while controlling the production cost and process complexity has significant scientific and commercial value. The present disclosure provides a photodiode device structure that improves the internal charge transfer speed and photo-generated charge collection efficiency with relatively low production cost and process difficulty.

Specifically, the substrate 101 has a first doping type, and has a first doping concentration. The first doping type may be n-type or p-type, and correspondingly, a second doping type may be p-type or n-type. In an example of the present disclosure, the first doping type is p-type and the second doping type is n-type.

In an example, the substrate 101 is a silicon substrate. In a specific example, a boron-doped p-type (p−) silicon wafer with a low doping concentration is used as the substrate.

In addition, as an example, the substrate 101 having the first doping type includes a first surface and a second surface opposite to the first surface. In an example, the top surface facing upwardly in the vertical direction of the substrate 101 as shown in FIG. 4 is used as the first surface for making other functional layers of the device in the substrate 101.

As an example, the shape of the substrate 101 in a top view may be rectangular, or may be hexagonal, octagonal, circular, etc., and may be selected according to actual needs.

Refer back to FIG. 4, the photodiode structure of the present disclosure further includes the functional doping area 102. The functional doping area 102 has a second doping type. In an example, the second doping type is n-type doping, such as n-doping. The functional doping area 102 adopts non-uniform doping. When the photo-generated carriers are collected in the functional doping area 102 (such as n− area), due to the non-uniform doping, a potential gradient associated with the concentration distribution will be formed in the functional doping area, and the carrier transport in the area can be controlled based on the potential gradient. For example, a self-built driving potential may be formed in the area, so that the carriers move toward a heavily doped area (n+ area). The potential difference formed in the functional doping area only needs to drive photo-generated carriers to move towards the auxiliary doping area. The method of the present disclosure can greatly increase the carrier transport speed compared to uniform doping. In addition, the manufacturing process of the present disclosure is much less difficult than conventional processes with an externally applied electric field and removes some of the limitations of practical using scenarios.

As an example, the doping concentration distribution method of the functional doping area 102 includes any one of linear distribution and square root distribution. For example, for linear distribution, the doping concentration may increase linearly along the direction of the arrow as shown in FIG. 4, i.e., toward the n+ area. Alternatively, in other examples, the doping concentration may increase by the square root along the direction of the arrow. The doping concentration may also change in more complex functional distribution relations. Linear and square root distribution are just more typical in formation of potential gradient doping distribution, and the method of the present disclosure can theoretically achieve any distribution function of doping.

As an example, the shape of the functional doping area 102 in a top view may be rectangular, or may be hexagonal, octagonal, circular, etc., and may be selected according to actual needs.

As an example, the functional doping area 102 is located in the substrate 101 and is formed by ion implantation from the first surface of the substrate 101. In a specific example, a lightly-doped N-type area (n− area) is fabricated using a non-uniform doping method. The doping of the n− area may use linear distribution, square root distribution, and other more complex functional distributions.

Refer back to FIG. 4, the photodiode structure of the present disclosure further includes the surface doping area 103. The surface doping area 103 is of the first doping type, and is formed in the functional doping area 102, and the top surface of the surface doping area 103 is flush with the first surface of the substrate 101. The surface doping area 103 has a second doping concentration.

As an example, the second doping concentration is greater than the first doping concentration. In an example, an edge of the surface doping area 103 at an end facing away from the gate structure 104 is flush with an outer edge of the functional doping area 102.

In a specific example, a thin layer of heavily-doped P-type area (p+ area) is deposited above the n− area.

As an example, the shape of the surface doping area 103 in a top view may be rectangular, or may be hexagonal, octagonal, circular, etc., and may be selected according to actual needs.

Refer back to FIG. 4, the photodiode structure of the present disclosure further includes the gate structure 104 located on the first surface of the substrate 101. The preparation process and material of the gate structure 104 can adopt conventional designs.

In an example, the gate structure 104 is connected to the functional doping area 102. An edge of the gate structure 104 near the functional doping area 102 is flush with an edge of the functional doping area 102 near the gate structure 104. The edge of the gate structure 104 near the functional doping area 102 and the edge of the functional doping area 102 near the gate structure 104 are located on the same plane and do not overlap. The gate structure 104 and the functional doping area 102 may have other positional relationships that can achieve the effect of the present disclosure.

Refer back to FIG. 4, the photodiode structure of the present disclosure further includes the auxiliary doping area 105 of a second doping type. The auxiliary doping area 105 connects the gate structure 104 to the functional doping area 102. The auxiliary doping area 105 is formed at least in the functional doping area 102, and the top surface of the auxiliary doping area 105 is flush with the first surface of the substrate 101. The auxiliary doping area 105 and the surface doping area 103 are spaced apart by an interval. The doping concentration of the auxiliary doping area 105 is greater than the doping concentration of the functional doping area 102. In an example, the doping concentration of the auxiliary doping area 105 is greater than the doping concentration of the functional doping area 102 at any location, and the doping concentration of the auxiliary doping area 105 and the doping concentration of the functional doping area 102 are not in the same order of magnitude.

In addition, the concentrations of the substrate (e.g., p− substrate), the functional doping area (e.g., n− doping area), the surface doping area (e.g., p+ doping area), and the auxiliary doping area (e.g., n+ doping area) vary from process plant to process plant, but are actually subject to negotiation with plants based on demands. In an example, the concentration of a p− area may range from $10^{15}$ to $10^{16}$ $cm^{-3}$, the concentration of an n− area may range from $10^{15}$ to $10^{16}$ $cm^{-3}$, and the concentration of an n+ area may range from $10^{18}$ to $10^{20}$ $cm^{-3}$. Other concentrations are also possible, as long as the doping concentration of the n− area is less than n, n being the concentration of intrinsic carriers in a silicon wafer.

As an example, the shape of the auxiliary doping area 105 in a top view may be rectangular, or may be hexagonal, octagonal, circular, etc., and may be selected according to actual needs. In addition, in an example, an edge of the auxiliary doping area 105 near the gate structure is flush with an edge of the functional doping area 102 near the gate structure, and the two together, realizing the connection between the gate structure 104 and the auxiliary doping area 105.

Based on the design of the present disclosure, the surface doping area 103, the functional doping area 102 and the substrate 101 form a PNP-type structure, which enables most of the area of the photodiode to be completely depleted during the circuit reset stage and improves the collection efficiency of photogenerated carriers. Further, based on the design of the auxiliary doping area 105, after the photogenerated carriers are collected in, for example, the n− area (the functional doping area 102), this area will form a potential gradient related to the concentration distribution due to non-uniform doping, which can greatly improve the carrier transport speed compared to uniform doping. The auxiliary doping area 105 can also be used as the drain structure of the device, which, together with the gate structure 104 and the source structure 106, constitutes the MOS device.

Figure 7:
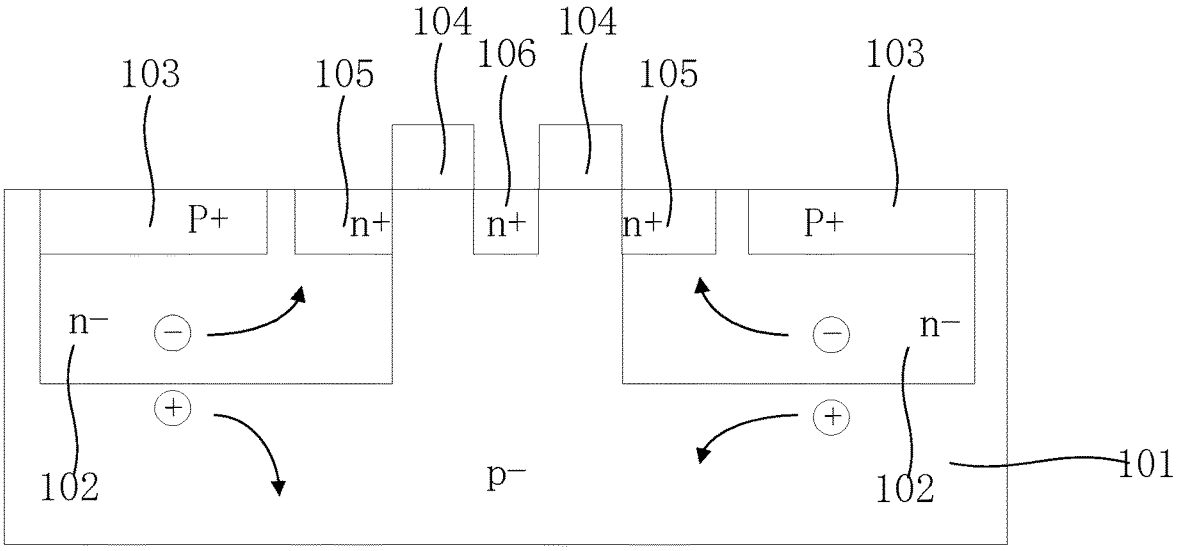
FIG. 7 shows a schematic working diagram of an internal structure of a transmission tube of a novel photodiode structure according to an embodiment of the present disclosure.

Refer to FIG. 7, in an example of the present disclosure, the n− area will form a built-in potential difference with a direction pointing toward the n+ area, and the photogenerated carriers in the n− area will be accelerated to move toward the n+ area under the action of the potential difference. In addition, during this process, the surface doping area 103 may have a blocking effect, and the tendency of diffusive motion is limited to a horizontal direction due to the blocking of the surface p+ area (surface doping area 103), thereby accelerating the photo-generated carriers moving toward the n+ area.

In an example, top surfaces of the substrate 101, the functional doping area 102, the surface doping area 103, and the auxiliary doping area 105 are flush with each other. The depth of the functional doping area 102 is less than the depth of the substrate 101, the depth of the surface doping area 103 is less than the depth of the functional doping area 102, and the depth of the auxiliary doping area 105 is less than the depth of the functional doping area 102. In further examples, the depth of the surface doping area 103 is equal to the depth of the auxiliary doping area 105. In other examples, a suitable depth range can be selected based on actual needs.

Figure 5:
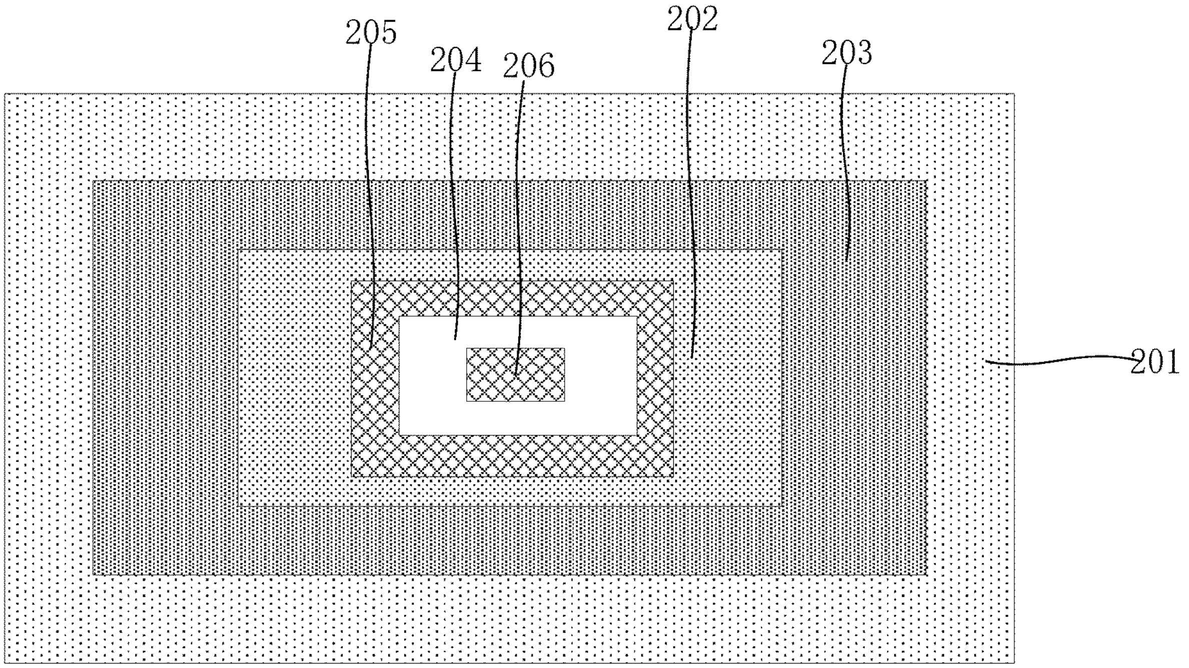
FIG. 5 shows a top view of a novel photodiode structure according to an embodiment of the present disclosure.
Figure 6:
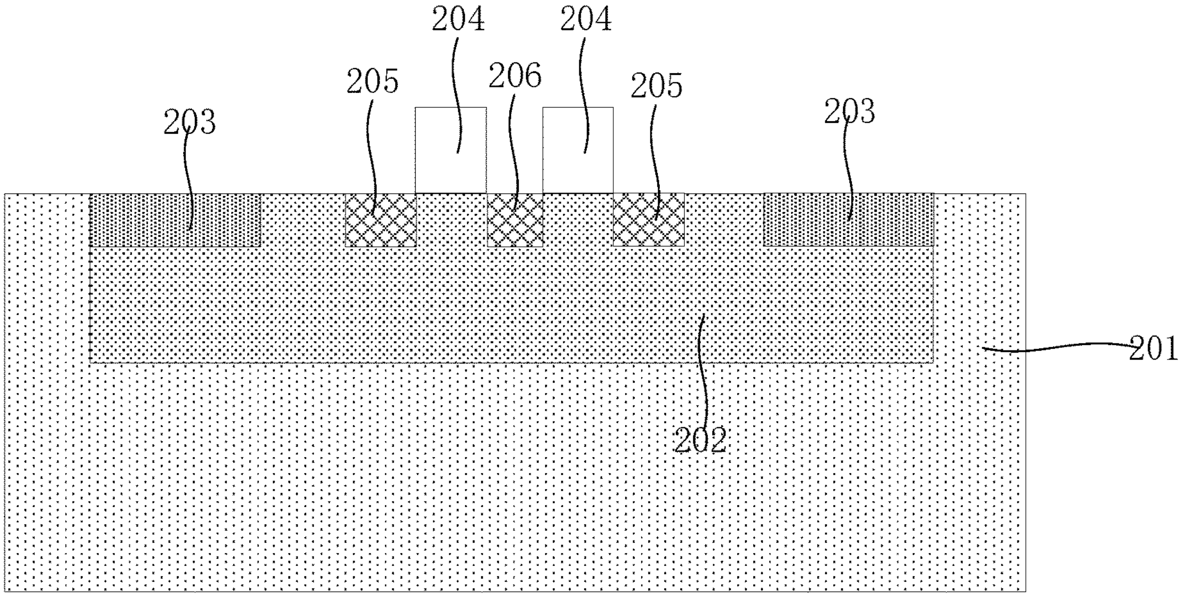
FIG. 6 shows a schematic cross-sectional view of the novel photodiode structure in FIG. 5.

As shown in FIGS. 5-6, as an example, the surface doping area 203 and the auxiliary doping area 205 both have a loop shape. The gate structure 204 is located within the auxiliary doping area 205 having the loop shape, and the gate structure 204 also has a loop shape. A source structure 206 is formed as an internal doping area in the functional doping area 202, and the internal doping area is located within an area surrounded by in inner edge of the loop shape formed by the gate structure 204. The internal doping area and the auxiliary doping area 205 have the same doping type and doping concentration.

Specifically, the auxiliary doping area 105 is provided in a loop shape at the periphery of the gate structure 104. In this regard, the loop structure increases the area, such as the n+ area of the loop structure, increases the area for receiving charges, and can receive the carriers transported from the n− area faster, thereby further enhancing the transport efficiency of photo-generated carriers. In a specific example, the auxiliary doping area 105 is obtained by ion implantation in a small portion of the loop connected to the transport gate (TG) to create a heavily doped N-type area (n+ area). In a further example, the gate structure 104, the surface doping area 103 and the auxiliary doping area 105 form concentric rings.

As an example, the first doping type is p-type, the second doping type is n-type, and the surface doping area, the functional doping area and the substrate form a PNP-type structure. The first and second doping types can be interchanged.

In addition, referring to FIG. 7 for a further illustration of the transport process of photogenerated carriers, with p− as a lightly doped silicon substrate, n+ as a heavily doped area, n− as a non-uniform low-concentration doping area and p+ as a surface heavily doped area, FIG. 7 shows a schematic diagram of the transport process of photogenerated carriers, when the diode reaches its reset voltage, most of the voltage falls in the heavily doped N-type area (n+ area), and the lightly doped N-type doping area (n− area) is completely depleted; when an optical signal is input, the photogenerated carriers are quickly collected to the n− area. Due to the non-uniform doping, the n− area will form a built-in potential difference in a direction toward the n+ area, and the photogenerated carriers in the n− area will be accelerated to move toward the n+ area under the action of the potential difference. In addition, the tendency of diffusive motion is limited to a horizontal direction due to the blocking of the surface p+ area, thereby accelerating the photo-generated carriers moving toward the n+ area. And the carriers that are collected in the n+ area will directly flow into the subsequent circuit through the transport gate (TG).

As shown in FIGS. 1-4, the present disclosure further provides a preparation method of a novel photodiode structure. The above described novel photodiode structure of the present disclosure is preferably prepared using the preparation method of the present disclosure. The specific photodiode structure and the description in the preparation method can be cross-referenced.

The preparation method of the novel photodiode structure of the present disclosure will be described in detail below in conjunction with the accompanying drawings. It should be noted that the order of the preparation method does not strictly represent the preparation order of the novel photodiode structure protected by the present disclosure, those skilled in the art can change the orders according to the actual process steps. FIG. 1 shows an example of the preparation steps of the novel photodiode structure.

Figure 2:
FIG. 2 shows a schematic diagram of a substrate in a novel photodiode structure according to an embodiment of the present disclosure.

Refer to S1 in FIG. 1 and FIG. 2, a substrate 101 of a first doping type is provided. The substrate 101 includes a first surface and a second surface opposite to the first surface. The substrate 101 has a first doping concentration. For details of the characteristics of the substrate 101, referring to the related description of the substrate 101 in FIG. 4. The substrate 101 may be a substrate structure obtained by doping all of it, or it can be a doped area obtained by doping a part of the initial substrate (e.g., a silicon substrate) for preparing subsequent layers of the photodiode structure.

Figure 3:
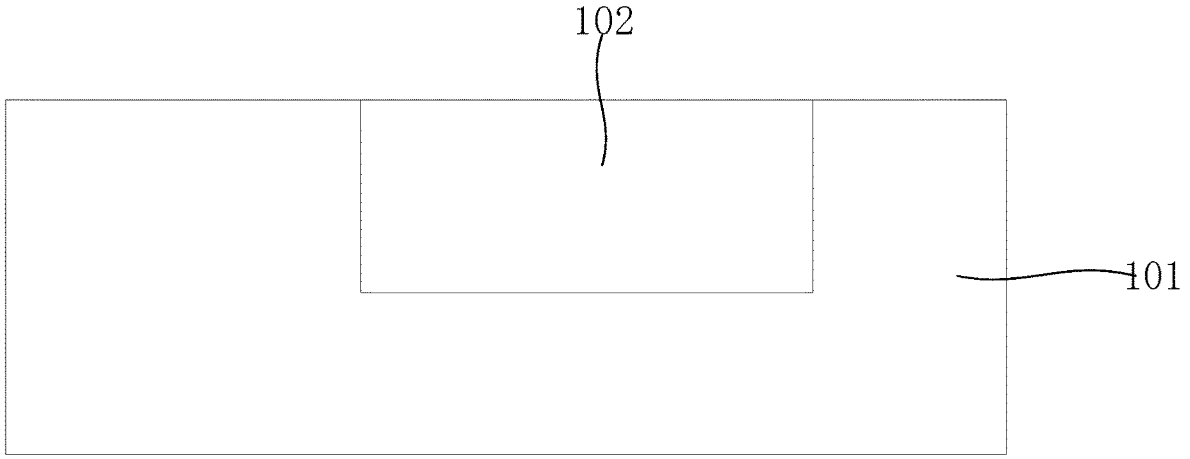
FIG. 3 shows a schematic diagram of a novel photodiode structure with a functional doping area according to an embodiment of the present disclosure.

Refer to S2 in FIG. 1 and FIG. 3, a functional doping area 102 of a second doping type is formed in the substrate 101 from the first surface. The functional doping area 102 has a non-uniform doping concentration distribution.

As an example, the functional doping area 102 may be formed by ion implantation based on a mask plate.

As an example, the functional doping area 102 with a predetermined concentration distribution is formed by ion implantation and diffusion of the implanted ions. In the example, a theory for realizing non-uniform doping distribution is proposed, which is based on the two stages of ion implantation and diffusion of the implanted ions. The theory can guide the design of a non-uniform doping structure with any concentration distribution function. In this case, the whole doping process is divided into two stages, ion implantation and diffusion, which are described as follows.

In the Ion Implantation Stage:

The ion implantation energy is set as D, and the concentration of the implanted ions is set as $C_0$. The ion implantation process is completed in a short time, and the main parameters of interest are the implantation energy as well as the implantation concentration. The average range $R_A$ of an impurity in silicon can be obtained by setting the implantation energy in the process. The average range, i.e., the value of the longitudinal depth, has a peak doping concentration after implantation and is approximately equal to the concentration at the time of implantation. The impurity concentration distribution of a point where the average range is located in the longitudinal direction can be approximated by taking the form of a Gaussian function. The longitudinal depth change when the peak doping concentration drops by half is recorded as $\Delta R_A$, and the longitudinal concentration distribution function is as follows:

$$C_y = C_0 \exp\left[-\frac{1}{2}\left(\frac{y-R_A}{\Delta R_A}\right)^2\right]$$

Based on the above approach, $C_y$ represents a concentration in the implantation direction, and y represents a position in the implantation direction. The ion doping concentration at any position in the longitudinal direction after implantation can be obtained from the ion implantation energy D and the ion implantation concentration $C_0$.

In the Diffusion Phase:

The moment of the end of the ion implantation stage is taken as the starting point of the diffusion process, with $C_0$ as the implantation point, the diffusion source is unique and does not vary with time because there is no longer any external interference. The homogeneous differential equation for the whole diffusion process can be established as follows:

$$\begin{cases} \frac{\partial C}{\partial t} = d^2 \frac{\partial^2 C}{\partial x^2} \\ C(x, t =) = f(x) \end{cases}$$

In this equation, x represents a distance from the ion implantation point, t represents a diffusion time, C represents a concentration, d represents a diffusion coefficient, C(x,t=0) represents the concentration distribution at the beginning of diffusion, and f(x) is a concentration distribution function at the beginning of diffusion; d is written in the form of a square in order to solve the mathematical equation more convenient, in the equation, $d^2=D$, but the original diffusion equation is established without knowing that D is easier for observation. This equation is more universal.

Since the crystalline system of silicon is isotropic, assuming that the diffusion coefficient D does not change with position, and that the boundary conditions are determined by the implantation concentration $C_0$, in the actual analysis, the above equation can be rewritten as follows:

$$\begin{cases} \frac{\partial C}{\partial t} = D\frac{\partial^2 C}{\partial x^2} \\ C(x, t=0) = C_0 \end{cases}$$

After solving the ordinary differential equation, assuming a coordinate value of the implantation point is $x_0$, the probability density of states can be obtained as follows:

$$C(x, t) = \frac{1}{2\sqrt{Dt\pi}} \int e^{-\frac{(x-x_0)^2}{(2\sqrt{Dt})^2}} C_0 dx$$

In this equation, C(x,t) represents the doping concentration at a position having a distance x from the ion implantation point at a diffusion time t. In addition, $\sqrt{Dt}$ in practice is the diffusion length to a single direction, so that $L=2\sqrt{Dt}$ is the characteristic length of the diffusion process, characterizing the diffusion distance in a one-dimensional space. In addition, in the actual process, ions are generally implanted through a mask gap rather than a point, and w represents a distance by which the ion implantation point is widen towards each of two opposite sides of the ion implantation point, where w characterizes a width of the mask opening so that the actual corresponding width of the mask gap is 2w, then the above equation can be expressed as follows:

$$C(x, t) = \frac{1}{L\sqrt{\pi}} \int_{x-w}^{x+w} e^{-\left(\frac{x-x_0}{L}\right)^2} C_0 dx$$

Based on the above approach, every actual physical quantity has a correspondence in the equation, and the corresponding doping concentration at any position at any time can be obtained. The analysis of the ion implantation at the first stage is approximating the distribution of a line in the longitudinal direction, without considering the lateral diffusion in the process of forming a normal distribution. In fact, due to the short time, this approximation is valid, each point corresponds to a concentration, this concentration is the $C_0$ in the equation in the second stage, which is the initial concentration of the diffusion process. The equation in the second stage is calculated as the final concentration distribution.

In addition, for arbitrary non-uniform doping, given its distribution function C(x), one ion implantation can be performed with n mask openings of different spacing, by the definition of the physical quantity of the equation, each mask opening corresponds to a characteristic length $$l = \frac{x_n - x_1}{n-1},$$

where $x_l$ is the position of the center of the first mask opening, $x_n$ is the position of the center of the last mask opening, the width of the $i_{th}$ mask opening is $$w_i = \frac{l}{2}\frac{C(x_i)}{C_0}.$$

The mask openings are used to determine the equation, and the integral is approximated as summing, then the equation is as follows:

$$C(x) = \int \frac{1}{l\sqrt{\pi}} \int_{x-w_i}^{x+w_i} e^{-\left(\frac{x-x_i}{L}\right)^2} C_0 dx \approx \sum_{i=1}^{n} C_0 \frac{1}{l\sqrt{\pi}} \int_{x-w_i}^{x+w_i} e^{-\left(\frac{x-x_i}{l}\right)^2} C_0 dx$$

Based on the above approach, the equation can be interpreted to mean that the concentration distribution using an infinite number of mask openings is exactly the same as the given doping distribution function. The calculation is highly universal, and the number of mask openings can be decided according to the actual demand. The more mask openings, the more accurate. Generally, linear non-uniform doping of a 100-micron device with ten mask openings is already very accurate.

Figure 8:
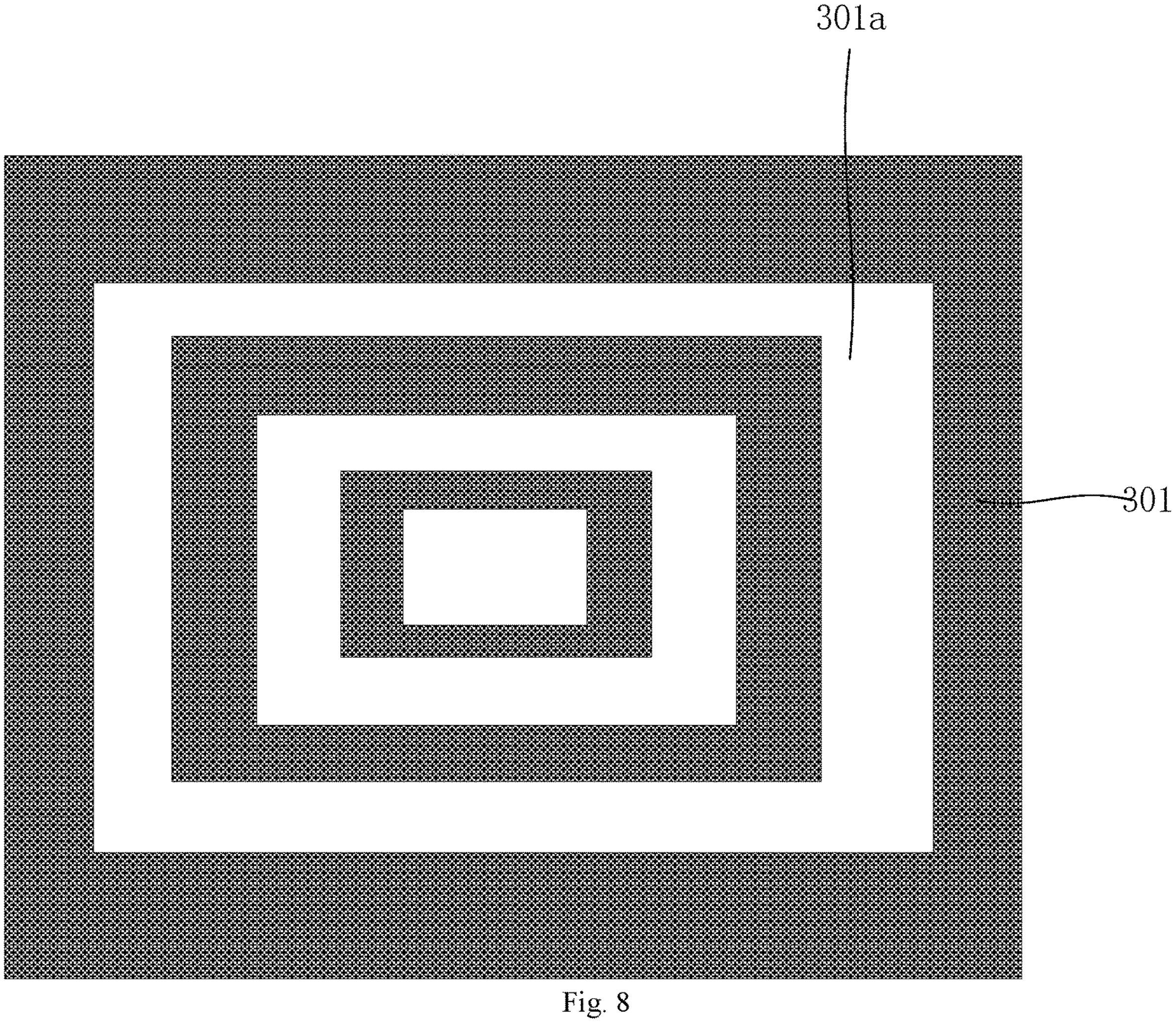
FIG. 8 shows a schematic diagram of a functional doping area formed using masks in a novel photodiode structure according to an embodiment of the present disclosure.

As an example, as shown in FIG. 8, a mask plate 301 is fabricated on the substrate 101, ion implantation is performed based on the mask plate to form the functional doping area 102, and multiple nested openings 301*a* with a loop shape are formed in the mask plate. The dimension of each of the openings 301*a* is set according to the concentration at the corresponding position of the opening.

In a specific example, the present disclosure provides a novel method for forming a non-uniform doping area (n−) having a loop shape, referring to the schematic diagram in FIG. 8. For the non-uniform doping area of n−, a variety of different doping methods can be used for different application environments. In the present disclosure, masks are manufactured using a method of depositing oxide, where an area to be doped is divided into multiple segments, each segment has a mask, the dimensions of the masks are set reasonably, then ion implantation is carried out once, and then ions are diffused for a long time, thereby achieving non-uniform doping of any given distribution. The actual diffusion time can be determined based on the calculated characteristic length L, which can be slightly extended and can be set according to the actual demand.

As shown in S3 in FIG. 1 and FIG. 4, the surface doping area 103 of the first doping type is formed in the functional doping area 102 from the first surface of the functional doping area 102, and the surface doping area 103 has a second doping concentration, which can be doped in a traditional manner.

As shown in S4 in FIG. 1 and FIG. 4, the gate structure 104 is formed on the first surface of the substrate 101.

As shown in S5 in FIG. 1 and FIG. 4, the auxiliary doping area 105 of the second doping type is formed in the functional doping area 102 from the first surface of the functional doping area 102. The auxiliary doping area 105 connects the gate structure 104 with the functional doping area 102, and the auxiliary doping area 105 is spaced at an interval from the surface doping area 103. The doping concentration of the auxiliary doping area 105 is greater than the doping concentration of the functional doping area 102.

Figure 9:
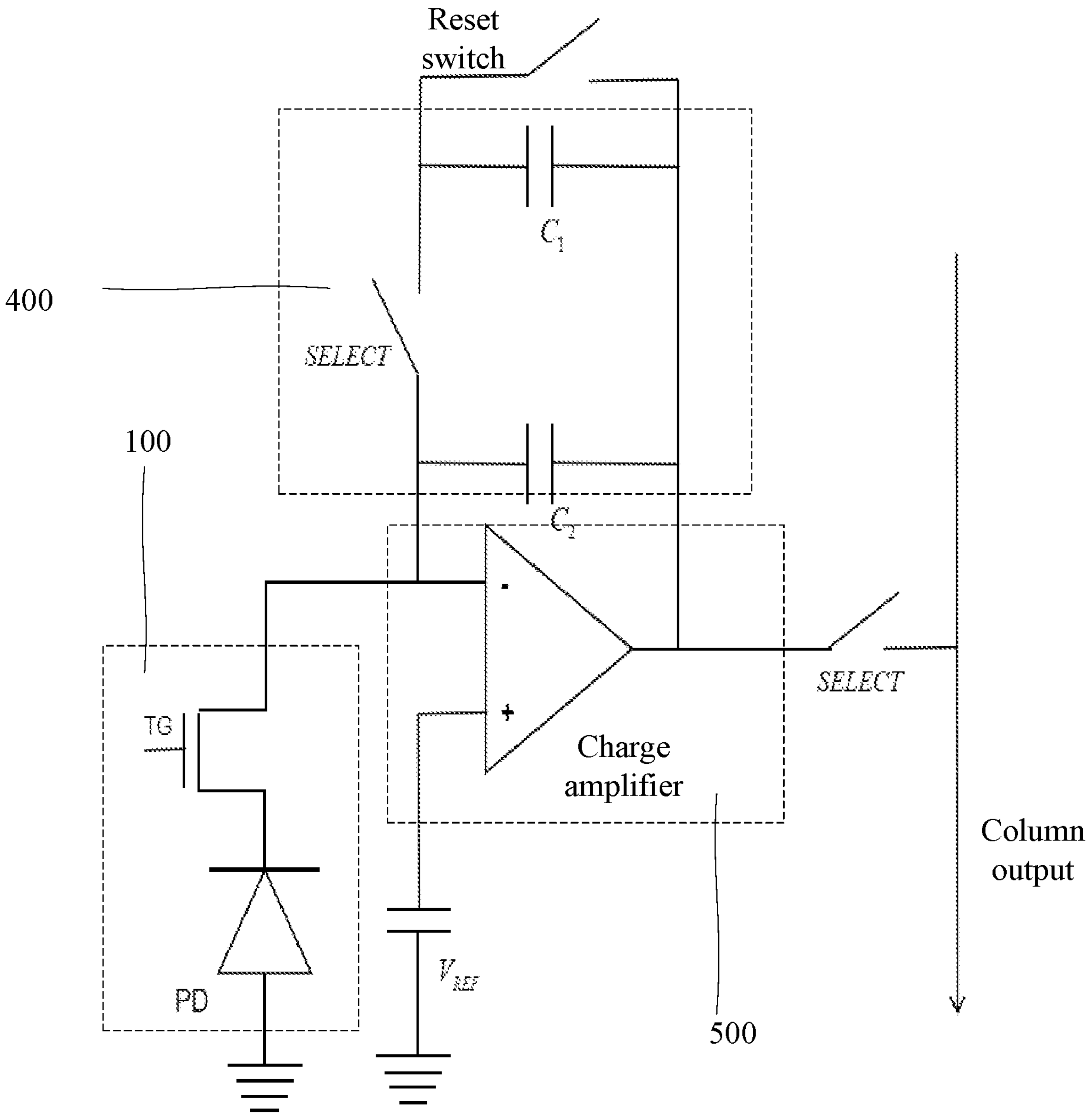
FIG. 9 shows a schematic diagram of a dual gain pixel circuit structure according to an embodiment of the present disclosure.

Further, as shown in FIG. 9, the present disclosure further provides a circuit structure using the novel photodiode structure as described in any one of the above examples. The circuit structure includes the novel photodiode structure 100, the surface doping area 103 grounded, a charge receiving module 400, and an amplifier module 500.

The charge receiving module 400 is electrically connected to a drain structure. The auxiliary doping area may act as the drain structure, it receives charges stored in the novel photodiode structure during reset (that is, the charges are received during reset), and includes an integrating capacitor and a control switch.

Two input ends of the amplifier module 500 are electrically connected to a comparison voltage and to the drain structure, respectively. The amplifier module 500 includes a charge amplifier and a control switch, and an output end of the amplifier module 500 outputs amplified signals. In addition, an output end of the charge amplifier is connected to an end of the integrating capacitor, and is further connected to the column output of pixels.

FIG. 9 shows a schematic circuit diagram of the novel photodiode structure of the present disclosure applied to a dual gain pixel. When the diode reaches its reset voltage, most of the voltage falls on the heavily doped N-type area (n+ area), i.e., the auxiliary doping area 105, while the lightly doped area is completely depleted. Electrons are collected in the lightly doped N-type area (n− area), i.e., the functional doping area 102, and are rapidly transferred to the heavily doped N-type area (n+ area) by a gradient potential. During the reset, the gate structure (TG) conducts and the charges stored on the photodiode will move to the integrating capacitor C1/C2.

In addition, the noise measured at the pixel output is associated with the reset operation:

$$\text{Noise}(V) = \frac{\sqrt{KTC_{diode}(VREF)}}{C}.$$

In this equation, $C_{diode}$ (VREF) represents a capacitance of a voltage reference (VREF), K represents the Boltzmann constant, $K=1.38\times10^{-23}$ $m^2$ $kgs^{-2}$ $K^{-1}$, and T represents a temperature. The value of Noise(V) is small due to the use of the diode structure of the present disclosure, which means that the noise floor of the pixel will is also small, thereby further enhancing the imaging effect. The present disclosure provides a photodiode device theory, structure and implementation method. Compared with the prior art, the present disclosure improves the charge transfer speed and collection efficiency in large-scale photodiodes and can reduce the noise generated by dark currents in addition to reducing industrial manufacturing difficulty and manufacturing cost.

In summary, in the novel photodiode structure, preparation method and circuit structure of the present disclosure, a non-uniformly doped functional doping area is formed, thus forming a self-built potential difference in the functional doping area and propelling the photo-generated carriers. For example, the photogenerated carriers may be accelerated by the potential difference, so that the collected carriers will directly enter the subsequent circuit through the transport gate (TG). In addition, the loop shape of the auxiliary doping area can increase the available area for receiving charges, in a result, the auxiliary doping area can receive the transported carriers faster, thereby further enhancing the transport efficiency of the photogenerated carriers. Therefore, the present disclosure effectively overcomes the shortcomings of the prior art and has a high industrial use value.

While particular elements, embodiments, and applications of the present disclosure have been shown and described, it is understood that the present disclosure is not limited thereto because modifications may be made by those skilled in the art, particularly in light of the foregoing teaching. It is therefore contemplated by the appended claims to cover such modifications and incorporate those features which come within the spirit and scope of the present disclosure.

What is claimed is:

1. A novel photodiode structure, comprising:

a substrate having a first doping type, wherein the substrate has a first doping concentration;

a functional doping area having a second doping type and formed in the substrate, wherein the functional doping area has a non-uniform doping concentration distribution, wherein a doping concentration of the functional doping area increases linearly along a horizontal direction;

a surface doping area having the first doping type and formed in the functional doping area from a top surface of the functional doping area, wherein the surface doping area has a second doping concentration;

a gate structure disposed on the substrate; and an auxiliary doping area having the second doping type and formed in the functional doping area, wherein the auxiliary doping area connects the gate structure to the functional doping area and is spaced by an interval from the surface doping area, wherein the auxiliary doping area has a doping concentration greater than a doping concentration of the functional doping area, wherein the horizontal direction points from the surface doping area toward the auxiliary doping area.

2. The novel photodiode structure according to claim 1, wherein the surface doping area and the auxiliary doping area both have a loop shape, wherein the gate structure is located within the auxiliary doping area having the loop shape, and the gate structure has a loop shape, wherein an internal doping area is formed in the functional doping area and is located within an area surrounded by an inner edge of the loop shape formed by the gate structure, wherein the internal doping area and the auxiliary doping area have the same doping type and doping concentration.

3. The novel photodiode structure according to claim 1, wherein the first doping type is p-type, and the second doping type is n-type, wherein the surface doping area, the functional doping area and the substrate form a PNP-type structure.

4. The novel photodiode structure according to claim 1, wherein the doping concentration distribution of the functional doping area includes any one of linear distribution, square root distribution.

5. A circuit structure comprising the novel photodiode structure as in claim 1, wherein the circuit structure comprises:

the novel photodiode structure, wherein the surface doping area of the novel photodiode structure is grounded;

a charge receiving module, electrically connected to a drain structure of the novel photodiode structure, receiving charges stored in the novel photodiode structure during reset, wherein the charge receiving module comprises an integrating capacitor and a control switch;

an amplifier module, wherein two input ends of the amplifier module are electrically connected to a comparison voltage and to the drain structure, respectively, and an output end of the amplifier module outputs the amplified signal, wherein the amplifier module comprises a charge amplifier and a control switch.

6. The circuit structure according to claim 5, wherein the output end of the amplifier module is connected to a column output of pixels, and a noise function at the column output of pixels is:

$$\text{Noise}(V) = \frac{\sqrt{KTC_{diode}(VREF)}}{C},$$

wherein K represents the Boltzmann constant, T represents a temperature, and $C_{diode}$ (VREF) represents a capacitance of a voltage reference (VREF).

7. The novel photodiode structure according to claim 1, wherein top surfaces of the substrate, the functional doping area, the surface doping area, and the auxiliary doping area are flush with each other.

8. The novel photodiode structure according to claim 1, wherein a depth of the functional doping area is less than a depth of the substrate; wherein a depth of the surface doping area is less than the depth of the functional doping area; wherein a depth of the auxiliary doping area is less than the depth of the functional doping area.

9. The novel photodiode structure according to claim 8, the depth of the surface doping area is equal to the depth of the auxiliary doping area.

10. The novel photodiode structure according to claim 1, wherein an edge of the surface doping area at an end facing away from the gate structure is flush with an outer edge of the functional doping area, wherein an edge of the gate structure near the functional doping area is flush with an edge of the functional doping area near the gate structure, and they are located on the same plane without overlapping.

11. The novel photodiode structure according to claim 10, wherein an edge of the auxiliary doping area near the gate structure is flush with the edge of the functional doping area near the gate structure.

12. The novel photodiode structure according to claim 1, wherein the gate structure, the surface doping area and the auxiliary doping area form concentric rings.

13. The novel photodiode structure according to claim 1, wherein a doping concentration of the auxiliary doping area is greater than the doping concentration of the functional doping area at any location, and the two concentrations are in different orders of magnitude.

14. The novel photodiode structure according to claim 1, wherein the second doping concentration is greater than the first doping concentration.

15. A method for preparing a novel photodiode structure, comprising:

providing a substrate having a first doping type, wherein the substrate comprises a first surface and a second surface opposite to the first surface, and the substrate has a first doping concentration;

forming a functional doping area having a second doping type in the substrate from the first surface, wherein the functional doping area has a non-uniform doping concentration distribution, wherein a doping concentration of the functional doping area increases linearly along a horizontal direction; wherein the functional doping area is formed by:

preparing a mask plate on the substrate, and performing ion implantation based on the mask plate to form the functional doping area, wherein a plurality of nested openings each with a loop shape is formed in the mask plate, wherein a dimension of each of the plurality of nested openings is set according to a concentration at a corresponding position of the each of the plurality of nested openings, wherein a concentration distribution function of a position x of the plurality of nested openings is:

$$C(x) = \int \frac{1}{l\sqrt{\pi}} \int_{x-w_i}^{x+w_i} e^{-\left(\frac{x-x_i}{L}\right)^2} C_0 dx \approx \sum_{i=1}^{n} C_0 \frac{1}{l\sqrt{\pi}} \int_{x-w_i}^{x+w_i} e^{-\left(\frac{x-x_i}{l}\right)^2} C_0 dx,$$

wherein $C_0$ represents a concentration of implanted ions, $x_i$ represents a position of the center of the $i^{th}$ opening of the plurality of nested openings, l represents a characteristic length of a diffusion process of each of the plurality of nested openings, and $$l = \frac{x_n - x_1}{n - 1},$$

a width of the $i^{th}$ opening of the plurality of nested openings, and $$w_i = \frac{l}{2} \frac{C(x_i)}{C_0}.$$

forming a surface doping area having the first doping type and formed in the functional doping area from the top surface, wherein the surface doping area has a second doping concentration;

forming a gate structure on the first surface of the substrate; and forming an auxiliary doping area having the second doping type in the functional doping area from the first surface, wherein the auxiliary doping area connects the gate structure to the functional doping area and is spaced by an interval from the surface doping area, wherein the auxiliary doping area has a doping concentration greater than a doping concentration of the functional doping area, wherein the horizontal direction points from the surface doping area toward the auxiliary doping area.

16. The method for preparing the novel photodiode structure according to claim 15, wherein the functional doping area has a predetermined concentration distribution and is formed by ion implantation and diffusion of implanted ions.

17. The method for preparing the novel photodiode structure according to claim 16, wherein a concentration distribution function of the functional doping area after ion implantation is:

$$C_y = C_0 \exp\left[-\frac{1}{2}\left(\frac{y - R_A}{\Delta R_A}\right)^2\right],$$

wherein $R_A$ represents an average range of an impurity in the substrate and corresponds to implantation energy, and has a peak doping concentration in an implantation direction, $\Delta R_A$ represents a depth change when the peak doping concentration drops by half, $C_y$ represents a concentration in the implantation direction; y represents a position in the implantation direction, and $C_0$ represents a concentration of the implanted ions.

18. The method for preparing the novel photodiode structure according to claim 17, wherein a concentration distribution function of the functional doping area during diffusion of the implanted ions is:

$$C(x, t) = \frac{1}{L\sqrt{\pi}} \int_{x-w}^{x+w} e^{-\left(\frac{x-x_0}{L}\right)^2} C_0 dx,$$

wherein $x_0$ represents a coordinate value of an ion implantation point, x represents a distance from the ion implantation point, $L=2\sqrt{Dt}$ represents a characteristic length of a diffusion process, D represents a diffusion coefficient, w represents a distance by which the ion implantation point is widen towards each of two opposite sides of the ion implantation point, and C(x,t) represents a concentration at a position having a distance x from the ion implantation point at a diffusion time t.

* * * * *